US012665602B2

(12) United States Patent
Liu et al.

(10) Patent No.: US 12,665,602 B2
(45) Date of Patent: Jun. 23, 2026

(54) PROGRAMMABLE CIRCUIT, INTEGRATED CIRCUIT, AND ELECTRONIC DEVICE

(71) Applicant: SHENZHEN PANGO MICROSYSTEMS CO., LTD, Shenzhen (CN)

(72) Inventors: Keyong Liu, Shenzhen (CN); Xiequn Lin, Shenzhen (CN); Zhenyuan Wang, Shenzhen (CN)

(73) Assignee: SHENZHEN PANGO MICROSYSTEMS CO., LTD, Shenzhen (CN)

( * ) Notice: Subject to any disclaimer, the term of this patent is extended or adjusted under 35 U.S.C. 154(b) by 1 day.

(21) Appl. No.: 18/767,995

(22) Filed: Jul. 10, 2024

(65) Prior Publication Data

US 2024/0364350 A1 Oct. 31, 2024

Related U.S. Application Data

(63) Continuation of application No. PCT/CN2022/091310, filed on May 6, 2022.

(30) Foreign Application Priority Data

Mar. 1, 2022 (CN) .......................... 202210197430.1

(51) Int. Cl.
*H03L 7/081* (2006.01)
*G11C 7/22* (2006.01)

(52) U.S. Cl.
CPC ............ *H03L 7/0814* (2013.01); *G11C 7/222* (2013.01); *H03L 7/0818* (2013.01)

(58) Field of Classification Search
None
See application file for complete search history.

(56) References Cited

U.S. PATENT DOCUMENTS

| | | | | |
|---|---|---|---|---|
| 7,515,668 B1 * | 4/2009 | Rokhsaz | ................. | H04L 7/033 |
| | | | | 375/376 |
| 7,990,783 B1 * | 8/2011 | Clarke | ................... | G11C 7/222 |
| | | | | 327/170 |
| 11,594,287 B2 * | 2/2023 | Kim | ....................... | G11C 7/222 |

* cited by examiner

*Primary Examiner* — Cassandra F Cox

(57) ABSTRACT

This application discloses a programmable circuit, an integrated circuit, and an electronic device. The programmable circuit comprising: a signal conversion module that converts parallel signal input from an external circuit into a serial signal; a signal configuration module that shifts the phase of the serial signal output by the signal conversion module by 0 degree or 360 degree; a first enable signal generation module that generates a first enable signal; a DDR configuration module that generates a second enable signal and sets the DDR mode of the programmable circuit; a phase monitoring module that monitors the phase of the DQS signal input from the external circuit and outputs the monitoring results; a phase adjustment module that adjusts the phase of the first enable signal generated by the first enable signal generation module based on the monitoring results input from the external circuit.

20 Claims, 3 Drawing Sheets gate_high=0 & gate_latch=0 & ddr4_mode=0 gate_high=0 & gate_latch=1 & ddr4_mode=0 gate_high=1 & gate_latch=1

200

300

PROGRAMMABLE CIRCUIT, INTEGRATED CIRCUIT, AND ELECTRONIC DEVICE

CROSS REFERENCE

The present disclosure is a continuation-application of International (PCT) Patent Application No. PCT/CN2022/091310, field on May 6, 2022 which claims priority of Chinese Patent Application No. 202210197430.1 field on Mar. 1, 2022 the entire contents of which are hereby incorporated by reference in their entirety.

TECHNICAL FIELD

The present application relates to the field of integrated circuit technology, especially relates to a programmable circuit, an integrated circuit, and an electronic device.

BACKGROUND

In DDR (Double Data Rate, double data rate synchronous dynamic random-access memory) memory, the DQS signal enters a high-impedance state during DDR3/4 (third and fourth generation DDR) read/write switching. Therefore, it is necessary to generate a DQS_gate (DQS window) through the DDR PHY (physical layer interface) to avoid the high-impedance state of the DQS signal and prevent read errors in DDR3/4.

The DDR PHY (physical layer interface) uses an internal signal with adjustable delay, rxena (enable signal), to sample the DQS signal during read operations. It returns a signal-bit sample based on the DQS signal. The delay of rxena is adjusted using the DQS Gate training algorithm, and continuous sample values are then evaluated to determine the position of the first rising edge of the read-returned DQS signal. The width of the DQS_gate is then determined by combining this with the read burst length. This feedback adjustment mechanism allows the DDR PHY to obtain an effective DQS window. After obtaining an effective DQS_gate, the DDR PHY needs to monitor the DQS jitter or CLK jitter caused by variations in voltage threshold (VT) in real-time. The gate position determined by the DQS Gate training may no longer be in the optimal position, so the DDR PHY requires the capability to dynamically adjust the DQS Gate.

The inventors realized that the DQS_gate obtained according to traditional technical solutions only covers half a UI (where one UI corresponds to the time interval of half a clock cycle). Therefore, when the DQS signal offset is greater than 0.5 UI, this solution cannot correctly eliminate the high-impedance state of the DQS signal, leading to errors in DQS sampling of DQ data. Additionally, this solution cannot set the system's DDR mode and lacks the real-time monitoring and correction functionality for DQS signal offset.

SUMMARY

The present application provides a programmable circuit, an integrated circuit, and an electronic device.

It solves the technical problem of existing circuits where the DQS_gate only covers half a UI when addressing DQS signal offset, making it unable to monitor and correct DQS signal offset in real-time. It also solves the technical problem of having a single DDR mode in the circuit.

A programmable circuit comprising:

a signal conversion module, which is configured for converting parallel signals input from an external circuit into a serial signal and outputting it to a signal configuration module;

the signal configuration module, which is configured for receiving the serial signal output by the signal conversion module and a second clock frequency signal input from the external circuit, shifting the phase of the serial signal output by the signal conversion module by 0 degree or 360 degrees, and outputting the phase-shifted serial signal to a first enable signal generation module;

the first enable signal generation module, which is configured for receiving the phase-shifted serial signal, generating a first enable signal, and outputting it to a DDR configuration module and a phase monitoring module;

the DDR configuration module, which is configured for receiving the DQS signal input from the external circuit and the first enable signal, generating a second enable signal; and setting DDR mode of the programmable circuit based on a first gate control signal input from the external circuit and a second gate control signal input from the external circuit, as well as the ddr_mode signal input to the phase monitoring module from the external circuit;

the phase monitoring module, which is configured for monitoring the phase of the DQS signal and outputting monitoring results to the external circuit;

a phase adjustment module, which is configured for adjusting the phase of the first enable signal generated by the first enable signal generation module based on the monitoring results input from the external circuit.

An integrated circuit comprising a programmable circuit, the programmable circuit comprises:

a signal conversion module, which is configured for converting parallel signals input from an external circuit into a serial signal and outputting it to a signal configuration module;

the signal configuration module, which is configured for receiving the serial signal output by the signal conversion module and a second clock frequency signal input from the external circuit, shifting the phase of the serial signal output by the signal conversion module by 0 degree or 360 degrees, and outputting the phase-shifted serial signal to a first enable signal generation module;

the first enable signal generation module, which is configured for receiving the phase-shifted serial signal, generating a first enable signal, and outputting it to a DDR configuration module and a phase monitoring module;

the DDR configuration module, which is configured for receiving the DQS signal input from the external circuit and the first enable signal, generating a second enable signal; and setting DDR mode of the programmable circuit based on a first gate control signal input from the external circuit and a second gate control signal input from the external circuit, as well as the ddr_mode signal input to the phase monitoring module from the external circuit;

the phase monitoring module, which is configured for monitoring the phase of the DQS signal and outputting monitoring results to the external circuit;

a phase adjustment module, which is configured for adjusting the phase of the first enable signal generated by the first enable signal generation module based on the monitoring results input from the external circuit.

An electronic device, comprising a device body and an integrated circuit located within the device body, the integrated circuit comprising a programmable circuit, the programmable circuit comprising:

a signal conversion module, which is configured for converting parallel signals input from an external circuit into a serial signal and outputting it to a signal configuration module;

the signal configuration module, which is configured for receiving the serial signal output by the signal conversion module and a second clock frequency signal input from the external circuit, shifting the phase of the serial signal output by the signal conversion module by 0 degree or 360 degrees, and outputting the phase-shifted serial signal to a first enable signal generation module;

the first enable signal generation module, which is configured for receiving the phase-shifted serial signal, generating a first enable signal, and outputting it to a DDR configuration module and a phase monitoring module;

the DDR configuration module, which is configured for receiving the DQS signal input from the external circuit and the first enable signal, generating a second enable signal; and setting DDR mode of the programmable circuit based on a first gate control signal input from the external circuit and a second gate control signal input from the external circuit, as well as the ddr_mode signal input to the phase monitoring module from the external circuit;

the phase monitoring module, which is configured for monitoring the phase of the DQS signal and outputting monitoring results to the external circuit;

a phase adjustment module, which is configured for adjusting the phase of the first enable signal generated by the first enable signal generation module based on the monitoring results input from the external circuit.

The programmable circuit, integrated circuit, and electronic device provided in this application can monitor and correct the offset state of the DQS signal in real-time, expanding the unit time interval of the DQS gate and preventing errors in DQS sampling of DQ data. Compared to previous solutions, this application can configure three DDR modes (DDR3, DDR4 1tCK, and DDR4 2tCK) by the DDR configuration module, making it applicable to DDR3 mode, DDR4 1tCK mode, and DDR4 2tCK mode.

DETAILED DESCRIPTION

The present disclosure will be further described below with reference to the accompanying drawings and embodiments.

In the following description, for purposes of explanation and not limitation, specific details are set forth, such as specific system structures, interfaces, techniques, etc., to provide a thorough understanding of the present disclosure.

The terms "system" and "network" are often configured interchangeably. The term "and/or" is only an association relationship to describe associated objects. The term "and/or" indicates that three relationships can exist. For example, A and/or B can mean that A exists alone, A and B exist at the same time, and B exists alone. In addition, the character "/" generally indicates that the related objects are "or". And the "multiple" means two or more.

Figure 1:
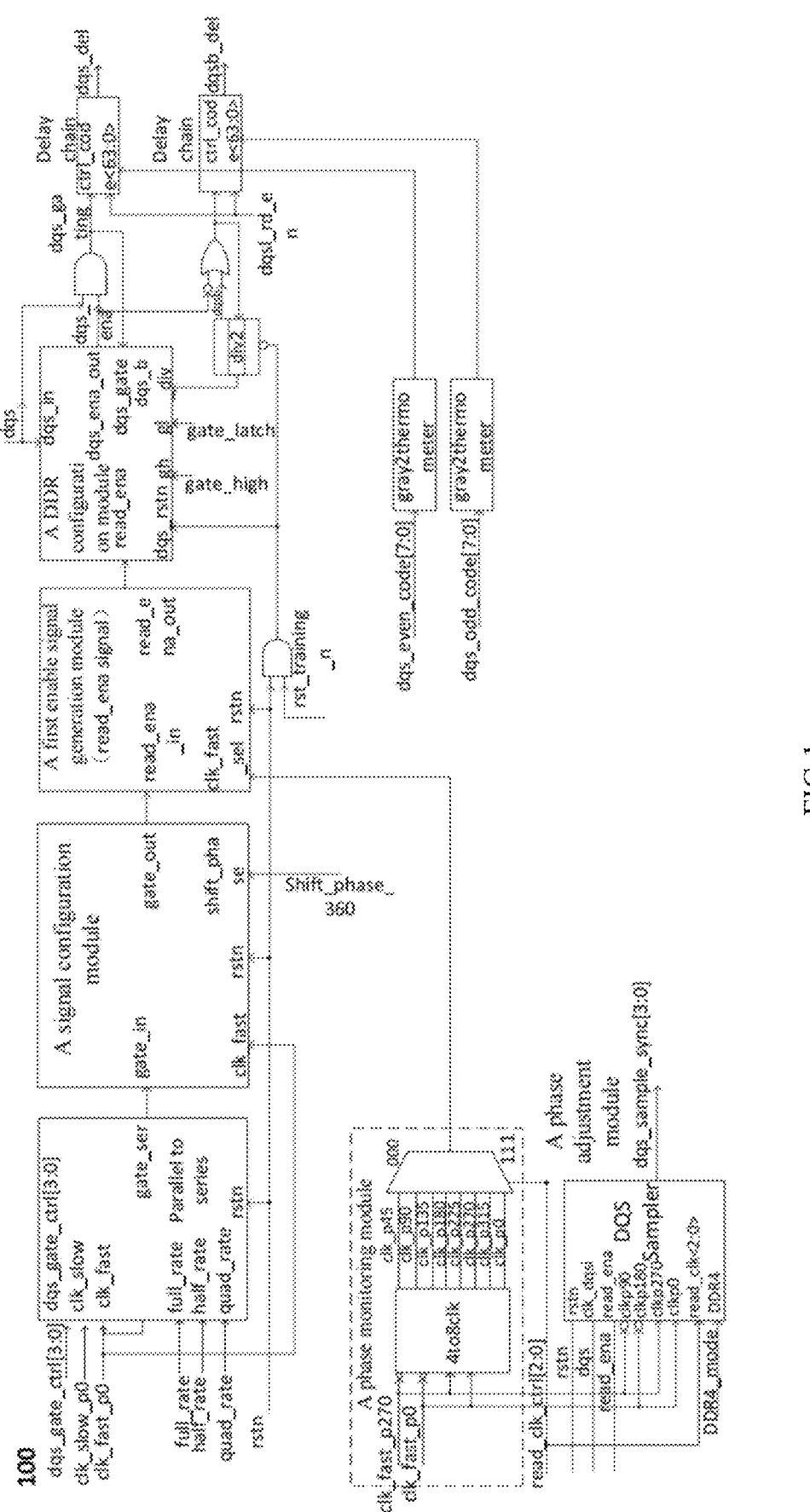
FIG. 1 shows a circuit connection diagram in an embodiment of the present application.

FIG. 1 is a circuit connection diagram provided by one embodiment of this application. As shown in FIG. 1, the programmable circuit 100 of this embodiment includes a signal conversion module (Parallel to Series), a signal configuration module, a first enable signal generation module, a DDR configuration module, a phase monitoring module, a phase adjustment module, a Gray-to-Thermometer code conversion module, and a delay chain module. It also includes a first AND gate connected to the reset terminal of each module, and a second AND gate and an OR gate connected to the DDR configuration module and the delay chain module, respectively.

Specifically, the signal conversion module (Parallel to Series) in this embodiment converts parallel signals input from an external circuit into serial signals and outputs them through the gate_ser port of the signal conversion module to the signal configuration module connected to the signal conversion module. The DQS_gate_ctrl[3:0] signal is a four-bit DQS gating signal control code. The external circuit in this embodiment refers to the external control circuit connected to the programmable circuit of this application and is not explained in detail in this embodiment.

The external circuit selects the rate mode of the signal conversion module. In the corresponding rate mode, the external circuit provides different states for the clock frequency and DQS_gate_ctrl[3:0] signal input to the signal conversion module. The rate modes of the signal conversion module include:

In the first rate mode (full_rate mode), the clock frequency of the first clock (clk_slow) in the signal conversion module is the same as the clock frequency of the second clock (clk_fast). In this mode, the serial signal of the signal conversion module uses only one bit of the DQS_gate_ctrl [0] signal.

In the second rate mode (half rate mode), the clock frequency of the first clock (clk_slow) in the signal conversion module is half of the clock frequency of the second clock (clk_fast), with a ratio of of 1:2. In this mode, the serial signal of the signal conversion module uses a two-bit DQS_gate_ctrl[2:0] signal.

In the third rate mode (quad rate mode), the clock frequency of the first clock (clk_slow) in the signal conversion module is one-fourth of the clock frequency of the second clock (clk_fast), with a ratio of of 1:4. In this mode, the serial signal of the signal conversion module uses a four-bit DQS_gate_ctrl[3:0] signal.

The signal configuration module in this embodiment which is configured for receiving the serial signal output from the signal conversion module and the second clock frequency signal input from the external circuit, and adjusting the phase of the serial signal from the signal conversion module by either 0 degrees or 360 degrees. Specifically, if the shift_phase_360 signal is triggered, the phase of the serial signal from the signal conversion module is shifted by 360 degrees; if this signal is not triggered, the phase remains unchanged. The phase-shifted serial signal is then output to the first enable signal (read_ena signal) generation module.

The first enable signal (read_ena signal) generation module in this embodiment which is configured for receiving the phase-shifted serial signal generating a first enable signal, and output it to the phase monitoring module and DDR configuration module.

Additionally, the first enable signal (read_ena signal) generation module receives the output signal from the phase adjustment module and adjusts the phase of the generated first enable signal (read_ena signal) accordingly. The phase adjustment does not exceed 45 degrees each time.

The DDR configuration module in this embodiment receives the first enable signal (read_ena signal) from the first enable signal generation module and generates the second enable signals (DQS_ena signal). Furthermore, the DDR configuration module is configured for setting the DDR mode of the programmable circuit based on the first gate control signal (gate_high signal), the second gate control signal (gate_latch signal), and the ddr_mode signal input from the external circuit to the phase monitoring module. The DDR mode options include DDR3 mode, DDR4 1tCK mode, and DDR4 2tCK mode.

Figure 2:
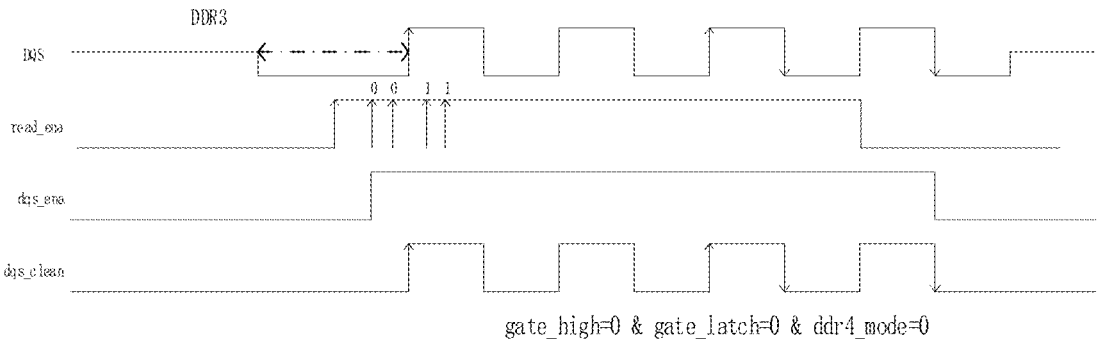
FIG. 2 shows an illustration of the DDR3 mode effect in an embodiment of the present application.

Specifically, FIG. 2 shows an illustration of the DDR3 mode effect provided by one embodiment of this application. As shown in FIG. 2, in DDR3 mode, the first gate control signal (gate_high signal) of the DDR configuration module is 0, the second gate control signal (gate_latch signal) is 0, and the ddr4_mode signal of the DQS phase monitoring module is 0. At this time, the DQS signal in the circuit have a maximum shift of 1 UI to the left or right, while still correctly removing the high-impedance state of the DQS signal, greatly enhancing the robustness of the DDR3 system.

Figure 3:
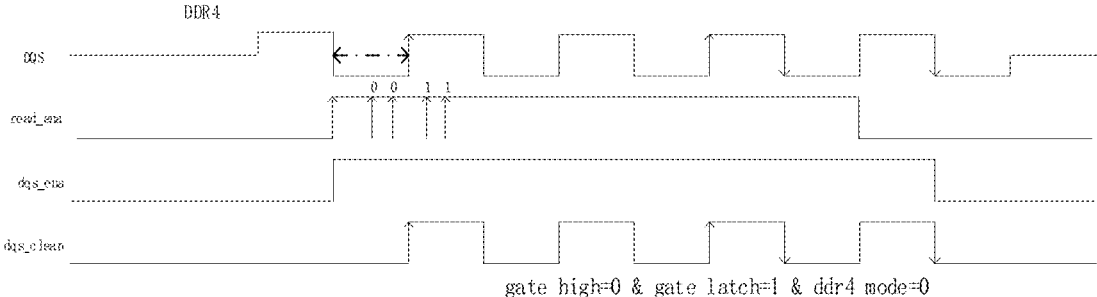
FIG. 3 shows an illustration of the DDR4 1tCK mode effect in an embodiment of the present application.

FIG. 3 shows an illustration of the DDR4 1tCK mode effect provided by one embodiment of this application. As shown in FIG. 3, in DDR4 1tCK mode, the first gate control signal (gate_high signal) of the DDR configuration module is 0, the second gate control signal (gate_latch signal) is 1, and the ddr4_mode signal of the DQS phase monitoring module is 0. At the same time, the DQS signal in the circuit have a maximum shift of 1 UI to the left or right, while still correctly removing the high-impedance state of the DQS signal, reducing the error rate in the DDR4 system RtCK mode.

Figure 4:
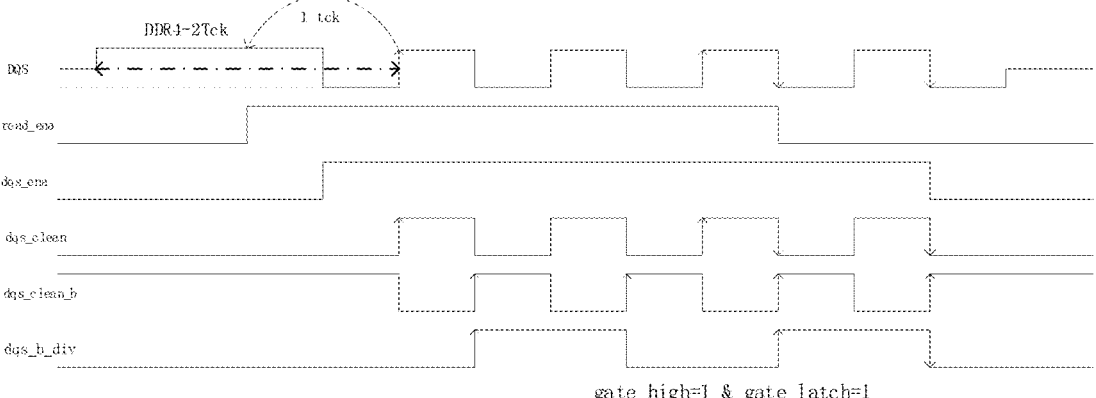
FIG. 4 shows an illustration of the DDR4 2tCK mode effect in an embodiment of the present application.

FIG. 4 shows an illustration of the DDR4 2tCK mode provided by one embodiment of this application. As shown in FIG. 4, in DDR4 2tCK mode, the first gate control signal (gate_high signal) of the DDR configuration module is 1, and the second gate control signal (gate_latch signal) is 1. At the same time, the DQS signal in the circuit have a maximum shift of 2 UI to the left or right, while still correctly removing the high-impedance state of the DQS signal, reducing the error rate in the DDR4 system 2tCK mode.

The phase monitoring module in this embodiment of the application monitors the phase of the DQS signal input from the external circuit and outputs the dqs_sample_sync[3:0] signal. The DQS phase monitoring module also receives four clock frequency signals input from the external circuit, with phases of 0 degrees, 90 degrees, 180 degrees, and 270 degrees, respectively. It receives the first enable signal (read_ena signal) output from the first enable signal generation module, and monitors the position that the phase of the DQS signal relative to the DQS_gating signal based on the DQS signal and the first enable signal (read_ena signal) generated by the first enable signal generation module. The first enable signal (read_ena signal) is processed by the DDR configuration module to generate the DQS_ena signal. The logical AND of the DQS_ena signal and the DQS signal generates the DQS_gating signal. Therefore, the position that the phase of the DQS signal relative to the DQS_gating signal can be determined based on the read_ena signal and the DQS signal.

Specifically, when the phase of the DQS signal is shifted to the left relative to the DQS_gating signal, the phase monitoring module outputs the dqs_sample_sync[3:0] signal as 0111 or 1111. When the phase of the DQS signal is shifted to the right relative to the DQS_gating signal, the phase monitoring module outputs the dqs_sample_sync[3:0] signal as 0000 or 0001. When the phase of the DQS signal is not shifted relative to the DQS_gating signal, the phase monitoring module outputs the dqs_sample_sync[3:0] signal as 0011.

The phase monitoring module in this embodiment also receives the read_clk_ctrl[2:0] signal input from the external circuit. The external circuit receives the output value from the DQS phase monitoring module and adjusts the read_clk_ctrl[2:0] signal based on this output value. Specifically, if the DQS phase monitoring module outputs 0111 or 1111, the value of the read_clk_ctrl[2:0] signal increases; if the DQS phase monitoring module outputs 0001 or 0000, the value of the read_clk_ctrl[2:0] signal decreases.

Further, the phase monitoring module also comprises the DDR4_mode signal input from the external circuit, which is used in conjunction with the DDR configuration module of this application to configure the DDR mode.

The phase adjustment module in this embodiment adjusts the phase of the first enable signal (read_ena signal) based on the monitoring results input from the external circuit, specifically the read_clk_ctrl[2:0] signal.

The phase adjustment module in this embodiment receives the read_clk_ctrl[2:0] signal input from the external circuit, as well as the clock frequency signal input from the external circuit. The "4to8clk" module (four-clock to eight-clock region) of the DQS_gating phase correction module increases the number of phases of the clock frequency signal. The phases of the clock frequency signal input from the external circuit are 0 degrees, 90 degrees, 180 degrees, and 270 degrees. After passing through the four-clock to eight-clock region of the DQS_gating phase correction module, the clock frequency signal phases become 0 degrees, 45 degrees, 90 degrees, 135 degrees, 180 degrees, 225 degrees, 270 degrees, and 315 degrees.

Then, based on the value of the read_clk_ctrl[2:0] signal, the phase of the first enable signal read_ena is increased or decreased by 45 degrees. If the value of the read_clk_ctrl[2:0] signal increases, the phase of the DQS_gating signal increases by 45 degrees. If the value of the read_clk_ctrl[2:0] signal decreases, the phase of the DQS_gating signal decreases by 45 degrees.

The Gray-to-Thermometer code conversion module in this embodiment converts the Gray code input from the external circuit into thermometer code and outputs it to the delay chain module.

The delay chain module in this embodiment comprises a first delay chain region and a second delay chain region. The first delay chain region which is configured for receiving the DQS_gating signal output from the second AND gate and the delay chain enable signal, generating the DQS delay signal (DQS del). The second delay chain region which is configured for receiving the logical OR signal output from the OR gate and the delay chain enable signal, generating the DQS phase direction delay signal (DQSb del). The delay chain module which is configured for generating a 45-degree phase shift between the DQS signal and the DQ signal.

In this embodiment, the first input terminal of the first AND gate receives a global reset signal from the external circuit. And the first input terminal of the first AND gate is connected to the reset terminals of the signal conversion module, the signal configuration module, the first enable signal (read_ena signal) generation module, the phase monitoring module, and the phase adjustment module. The second input terminal of the first AND gate receives a local reset signal from the external circuit. The output terminal of the first AND gate is connected to the reset terminals of the DDR configuration module and the frequency divider.

In this embodiment, the first input terminal of the second AND gate receives the DQS signal from the external circuit, and the second input terminal receives the second enable signal (DQS_ena signal) output from the DDR configuration module. The output terminal of the second AND gate outputs the logical AND signal, i.e., the DQS_gating signal, to the delay chain module and the DDR configuration module.

In this embodiment, the first input terminal of the OR gate receives the DQS phase direction signal from the external circuit, and the second input terminal receives the second enable signal (DQS_ena signal) output from the DDR configuration module. The second input terminal of the OR gate is low-level triggered. The output terminal of the OR gate outputs the logical OR signal to the delay chain module and the frequency divider.

The input terminal of the frequency divider in this embodiment receives the logical OR signal output from the OR gate. The output terminal of the frequency divider outputs the half-frequency signal of the DQS phase direction signal to the DDR configuration module.

Figure 5:
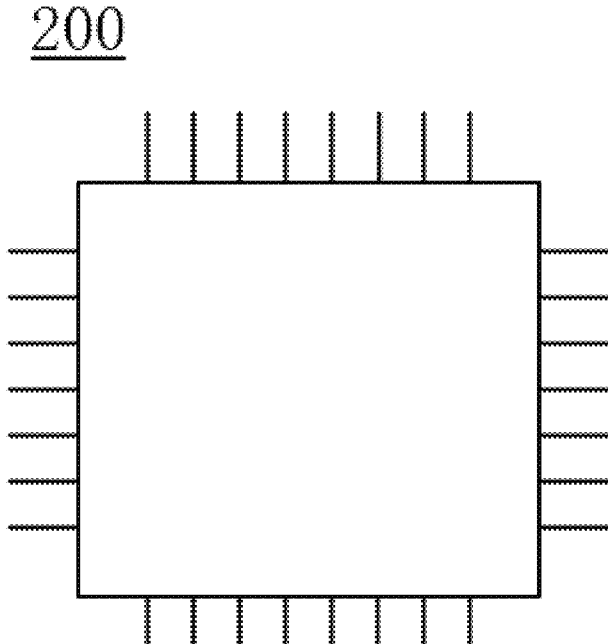
FIG. 5 shows a schematic diagram of the integrated circuit structure in an embodiment of the present application.

FIG. 5 is a schematic diagram of an integrated circuit structure provided by an embodiment of this application. As shown in FIG. 5, the embodiment of this application also provides an integrated circuit 200, which includes the aforementioned programmable circuit.

Figure 6:
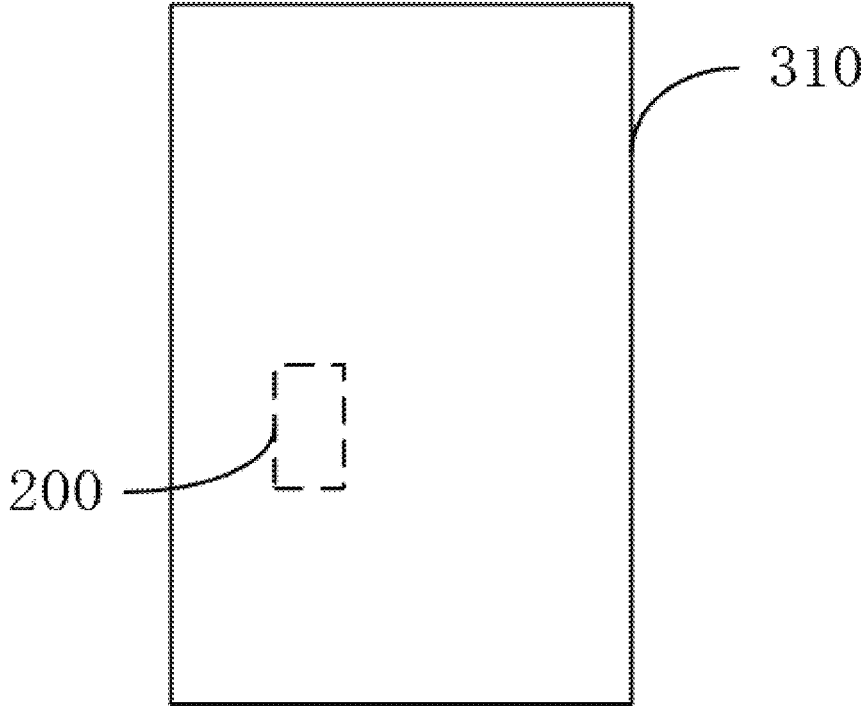
FIG. 6 shows a schematic diagram of the electronic device structure in an embodiment of the present application.

FIG. 6 is a schematic diagram of an electronic device structure provided by an embodiment of this application. As shown in FIG. 6, the embodiment of this application also provides an electronic device 300, which includes device body 310 and the aforementioned integrated circuit 200, wherein the integrated circuit 200 is located within the device body 310.

Those skilled in the art will clearly understand that, for convenience and brevity of description, the division of the functional units and modules above is merely exemplary. In practical applications, the described functions can be distributed among different functional units or modules as needed. This means that the internal structure of the apparatus can be divided into different functional units or modules to complete all or part of the functions described above.

The above-described embodiments are merely embodiments of the present disclosure. For those skilled in the art, improvements can be made without departing from the concept of the present disclosure, but these improvements all belong to the protection scope of the present disclosure.

What is claimed is:

1. A programmable circuit comprising:

a signal conversion module, which is configured for converting parallel signals input from an external circuit into a serial signal and outputting it to a signal configuration module;

the signal configuration module, which is configured for receiving the serial signal output by the signal conversion module and a second clock frequency signal input from the external circuit, shifting the phase of the serial signal output by the signal conversion module by 0 degree or 360 degrees, and outputting the phase-shifted serial signal to a first enable signal generation module;

the first enable signal generation module, which is configured for receiving the phase-shifted serial signal, generating a first enable signal, and outputting it to a DDR configuration module and a phase monitoring module;

the DDR configuration module, which is configured for receiving the DQS signal input from the external circuit and the first enable signal, generating a second enable signal; and setting DDR mode of the programmable circuit based on a first gate control signal input from the external circuit and a second gate control signal input from the external circuit, as well as a ddr_mode signal input to the phase monitoring module from the external circuit;

the phase monitoring module, which is configured for monitoring the phase of the DQS signal and outputting monitoring results to the external circuit, receiving the first enable signal output from the first enable signal generation module, and monitoring the position that the phase of the DQS signal relative to a DQS_gating signal based on the DQS signal and the first enable signal generated by the first enable signal generation module; the first enable signal is processed by the DDR configuration module to generate the DQS_ena signal, the logical AND of the DQS_ena signal and the DQS signal generates the DQS_gating signal; the phase monitoring module receives the read_clk_ctrl[2:0] signal input from the external circuit; the external circuit receives the output value from the output terminal of the phase monitoring module, based on the output value from the output terminal of the phase monitoring module;

a phase adjustment module, which is configured for adjusting the phase of the first enable signal generated by the first enable signal generation module based on the monitoring results input from the external circuit.

2. The programmable circuit as claimed in claim 1, further comprising a first AND gate, a second AND gate, an OR gate, and a frequency divider;

a first input terminal of the first AND gate receives the global reset signal from the external circuit and is connected to the reset terminals of the signal conversion module, the signal configuration module, the first enable signal generation module, the phase monitoring module, and the phase adjustment module; a second input terminal of the first AND gate receives the local reset signal from the external circuit; an output terminal of the first AND gate is connected to the reset terminals of the DDR configuration module and the frequency divider;

a first input terminal of the second AND gate receives the DQS signal from the external circuit, and the second input terminal receives the second enable signal outputted by the DDR configuration module; the output terminal of the second AND gate outputs the logical AND signal of the DQS signals and the second enable signal to the DDR configuration module, the logical AND signal is referred to as the DQS_gating signal;

a first input terminal of the OR gate receives the DQS phase direction signal from the external circuit, and a second input terminal receives the second enable signal outputted by the DDR configuration module, a second input terminal of the OR gate is triggered at a low level, an output terminal of the OR gate outputs the logical OR signal to the frequency divider;

an input terminal of the frequency divider receives the logical OR signal outputted from the OR gate, and an output terminal of the frequency divider outputs the half-frequency signal of the DQS phase direction signal to the DDR configuration module.

3. The programmable circuit as claimed in claim 2, further comprising:

a Gray-to-Thermometer Code conversion module, which is configured for converting the Gray code input from the external circuit into thermometer code and outputting it to a delay chain module;

the delay chain module comprises a first delay chain region and a second delay chain region, the first delay chain region which is configured for receiving the DQS_gating signal outputted by the second AND gate and the delay chain enable signal, the second delay chain region which is configured for receiving the logical OR signal outputted by the OR gate and the delay chain enable signal, the delay chain module which is configured for generating a 45-degree phase shift between the DQS signal and the DQ signal.

4. The programmable circuit as claimed in claim 2, wherein a phase monitoring module which is configured for monitoring the phase of the DQS signal, further comprising:

receiving four clock frequency signals input from the external circuit, with the phases of these four clock frequency signals being 0 degrees, 90 degrees, 180 degrees, and 270 degrees, respectively;

receiving the first enable signal output by the first enable signal generation module; and monitoring the position that the phase of the DQS signal input from the external circuit relative to the DQS_gating signal, based on the DQS signal input from the external circuit and the first enable signal output by the first enable signal generation module;

if the phase of the DQS signal is shifted to the left relative to the DQS_gating signal, the phase monitoring module outputs 0111 or 1111;

if the phase of the DQS signal is shifted to the right relative to the DQS_gating signal, the phase monitoring module outputs 0000 or 0001;

if the phase of the DQS signal is not shifted relative to the DQS_gating signal, the phase monitoring module outputs 0011.

5. The programmable circuit as claimed in claim 4, wherein the phase monitoring module which is configured for outputting monitoring results to the external circuit, further comprising:

the external circuit adjusts the read_clk_ctrl[2:0] signal, when the output of the phase monitoring module is 0111 or 1111, the value of the read_clk_ctrl[2:0] signal increases, when the output of the phase monitoring module is 0001 or 0000, the value of the read_clk_ctrl [2:0] signal decreases.

6. The programmable circuit as claimed in claim 5, wherein a phase adjustment module which is configured for adjusting the phase of the first enable signal generated by the first enable signal generation module based on the monitoring results input from the external circuit, further comprising:

receiving the read_clk_ctrl[2:0] signal input from the external circuit;

receiving the clock frequency signal input from the external circuit, and increasing the number of phases of the clock frequency signal through the four-clock to eight-clock region of the phase adjustment module, the original phases of the clock frequency signals input from the external circuit are 0 degrees, 90 degrees, 180 degrees, and 270 degrees, while the phases of the clock frequency signals after passing through the four-clock to eight-clock region of the phase adjustment module are 0 degrees, 45 degrees, 90 degrees, 135 degrees, 180 degrees, 225 degrees, 270 degrees, and 315 degrees;

based on the value of the read_clk_ctrl[2:0] signal, the phase of the first enable signal generated by the first enable signal generation module is increased or decreased by 45 degrees, when the value of the read_clk_ctrl[2:0] signal increases, the phase of the DQS_gating signal increases by 45 degrees, when the value of the read_clk_ctrl[2:0] signal decreases, the phase of the DQS_gating signals decreases by 45 degrees.

7. The programmable circuit as claimed in claim 1, wherein the parallel signal is a 4-bit DQS_gate_ctrl signal, the signal conversion module further comprising:

a first rate mode, where the clock frequency of the first clock (clk_slow) in the signal conversion module is equal to the clock frequency of the second clock (clk_fast), and the serial signal uses a single-bit DQS_gate_ctrl signal;

a second rate mode, where the clock frequency of the first clock (clk_slow) in the signal conversion module is half of the clock frequency of the second clock (clk_fast), with a ratio of 1:2, and the serial signal uses a two-bit DQS_gate_ctrl signal;

a third rate mode, where the clock frequency of the first clock (clk_slow) in the signal conversion module is one-fourth of the clock frequency of the second clock (clk_fast), with a ratio of 1:4, and the serial signal uses a four-bit DQS_gate_ctrl signal;

the clock frequency of the first clock and the clock frequency of the second clock are provided by the external circuit.

8. The programmable circuit as claimed in claim 1, wherein the DDR configuration module which is configured for receiving the DQS signal input from the external circuit and the first enable signal, generating a second enable signal; and setting DDR mode of the programmable circuit based on a first gate control signal input from the external circuit and a second gate control signal input from the external circuit, as well as the ddr_mode signal input to the phase monitoring module from the external circuit, further comprising:

setting a DDR3 mode, where the first gate control signal is 0, the second gate control signal is 0, and the ddr4_mode signal is 0;

setting a DDR4 1tCK mode, where the first gate control signal is 0, the second gate control signal is 1, and the ddr4_mode signal is 0;

setting a DDR4 2tCK mode, where the first gate control signal is 1 and the second gate control signal is 1;

the ddr4_mode signal is input from the external circuit to the phase monitoring module.

9. An integrated circuit comprising a programmable circuit, the programmable circuit comprises:

a signal conversion module, which is configured for converting parallel signals input from an external circuit into a serial signal and outputting it to a signal configuration module;

the signal configuration module, which is configured for receiving the serial signal output by the signal conversion module and a second clock frequency signal input from the external circuit, shifting the phase of the serial signal output by the signal conversion module by 0 degree or 360 degrees, and outputting the phase-shifted serial signal to a first enable signal generation module;

the first enable signal generation module, which is configured for receiving the phase-shifted serial signal, generating a first enable signal, and outputting it to a DDR configuration module and a phase monitoring module;

the DDR configuration module, which is configured for receiving the DQS signal input from the external circuit and the first enable signal, generating a second enable signal; and setting DDR mode of the programmable circuit based on a first gate control signal input from the external circuit and a second gate control signal input from the external circuit, as well as a ddr_mode signal input to the phase monitoring module from the external circuit;

the phase monitoring module, which is configured for monitoring the phase of the DQS signal and outputting monitoring results to the external circuit; receiving the first enable signal output from the first enable signal generation module, and monitoring the position that the phase of the DQS signal relative to a DQS_gating signal based on the DQS signal and the first enable signal generated by the first enable signal generation module; the first enable signal is processed by the DDR configuration module to generate the DQS_ena signal, the logical AND of the DQS_ena signal and the DQS signal generates the DQS_gating signal; the phase monitoring module receives the read_clk_ctrl[2:0] signal input from the external circuit; the external circuit receives the output value from the output terminal of the phase monitoring module, based on the output value from the output terminal of the phase monitoring module;

a phase adjustment module, which is configured for adjusting the phase of the first enable signal generated by the first enable signal generation module based on the monitoring results input from the external circuit.

10. The integrated circuit as claimed in claim 9, wherein the programmable circuit further comprises a first AND gate, a second AND gate, an OR gate, and a frequency divider;

a first input terminal of the first AND gate receives the global reset signal from the external circuit and is connected to the reset terminals of the signal conversion module, the signal configuration module, the first enable signal generation module, the phase monitoring module, and the phase adjustment module; a second input terminal of the first AND gate receives the local reset signal from the external circuit; an output terminal of the first AND gate is connected to the reset terminals of the DDR configuration module and the frequency divider;

a first input terminal of the second AND gate receives the DQS signal from the external circuit, and the second input terminal receives the second enable signal outputted by the DDR configuration module; the output terminal of the second AND gate outputs the logical AND signal of the DQS signals and the second enable signal to the DDR configuration module, the logical AND signal is referred to as the DQS_gating signal;

a first input terminal of the OR gate receives the DQS phase direction signal from the external circuit, and a second input terminal receives the second enable signal outputted by the DDR configuration module, a second input terminal of the OR gate is triggered at a low level, an output terminal of the OR gate outputs the logical OR signal to the frequency divider;

an input terminal of the frequency divider receives the logical OR signal outputted from the OR gate, and an output terminal of the frequency divider outputs the half-frequency signal of the DQS phase direction signal to the DDR configuration module.

11. The integrated circuit as claimed in claim 10, wherein the programmable circuit further comprising:

a Gray-to-Thermometer Code conversion module, which is configured for converting the Gray code input from the external circuit into thermometer code and outputting it to a delay chain module;

the delay chain module comprises a first delay chain region and a second delay chain region, the first delay chain region which is configured for receiving the DQS_gating signal outputted by the second AND gate and the delay chain enable signal, the second delay chain region which is configured for receiving the logical OR signal outputted by the OR gate and the delay chain enable signal, the delay chain module which is configured for generating a 45-degree phase shift between the DQS signal and the DQ signal.

12. The integrated circuit as claimed in claim 10, wherein the parallel signal is a 4-bit DQS_gate_ctrl signal, the signal conversion module further comprising:

a first rate mode, where the clock frequency of the first clock (clk_slow) in the signal conversion module is equal to the clock frequency of the second clock (clk_fast), and the serial signal uses a single-bit DQS_gate_ctrl signal;

a second rate mode, where the clock frequency of the first clock (clk_slow) in the signal conversion module is half of the clock frequency of the second clock (clk_fast), with a ratio of 1:2, and the serial signal uses a two-bit DQS_gate_ctrl signal;

a third rate mode, where the clock frequency of the first clock (clk_slow) in the signal conversion module is one-fourth of the clock frequency of the second clock (clk_fast), with a ratio of 1:4, and the serial signal uses a four-bit DQS_gate_ctrl signal;

the clock frequency of the first clock and the clock frequency of the second clock are provided by the external circuit.

13. The integrated circuit as claimed in claim 10, wherein a phase monitoring module which is configured for monitoring the phase of the DQS signal, further comprising:

receiving four clock frequency signals input from the external circuit, with the phases of these four clock frequency signals being 0 degrees, 90 degrees, 180 degrees, and 270 degrees, respectively;

receiving the first enable signal output by the first enable signal generation module; and monitoring the position that the phase of the DQS signal input from the external circuit relative to the DQS_gating signal, based on the DQS signal input from the external circuit and the first enable signal output by the first enable signal generation module;

if the phase of the DQS signal is shifted to the left relative to the DQS_gating signal, the phase monitoring module outputs 0111 or 1111;

if the phase of the DQS signal is shifted to the right relative to the DQS_gating signal, the phase monitoring module outputs 0000 or 0001;

if the phase of the DQS signal is not shifted relative to the DQS_gating signal, the phase monitoring module outputs 0011.

14. The integrated circuit as claimed in claim 13, wherein the phase monitoring module which is configured for outputting monitoring results to the external circuit, further comprising:

the external circuit adjusts the read_clk_ctrl[2:0] signal, when the output of the phase monitoring module is 0111 or 1111, the value of the read_clk_ctrl[2:0] signal increases, when the output of the phase monitoring module is 0001 or 0000, the value of the read_clk_ctrl [2:0] signal decreases.

15. The integrated circuit as claimed in claim 14, wherein a phase adjustment module which is configured for adjusting the phase of the first enable signal generated by the first enable signal generation module based on the monitoring results input from the external circuit, further comprising:

receiving the read_clk_ctrl[2:0] signal input from the external circuit;

receiving the clock frequency signal input from the external circuit, and increasing the number of phases of the clock frequency signal through the four-clock to eight-clock region of the phase adjustment module, the original phases of the clock frequency signals input from the external circuit are 0 degrees, 90 degrees, 180 degrees, and 270 degrees, while the phases of the clock frequency signals after passing through the four-clock to eight-clock region of the phase adjustment module are 0 degrees, 45 degrees, 90 degrees, 135 degrees, 180 degrees, 225 degrees, 270 degrees, and 315 degrees;

based on the value of the read_clk_ctrl[2:0] signal, the phase of the first enable signal generated by the first enable signal generation module is increased or decreased by 45 degrees, when the value of the read_clk_ctrl[2:0] signal increases, the phase of the DQS_gating signal increases by 45 degrees, when the value of the read_clk_ctrl[2:0] signal decreases, the phase of the DQS_gating signals decreases by 45 degrees.

16. The integrated circuit as claimed in claim 9, wherein the DDR configuration module which is configured for receiving the DQS signal input from the external circuit and the first enable signal, generating a second enable signal; and setting DDR mode of the programmable circuit based on a first gate control signal input from the external circuit and a second gate control signal input from the external circuit, as well as the ddr_mode signal input to the phase monitoring module from the external circuit, further comprising:

setting a DDR3 mode, where the first gate control signal is 0, the second gate control signal is 0, and the ddr4_mode signal is 0;

setting a DDR4 1tCK mode, where the first gate control signal is 0, the second gate control signal is 1, and the ddr4_mode signal is 0;

setting a DDR4 2tCK mode, where the first gate control signal is 1 and the second gate control signal is 1;

the ddr4_mode signal is input from the external circuit to the phase monitoring module.

17. An electronic device, comprising a device body and an integrated circuit located within the device body, the integrated circuit comprising a programmable circuit, the programmable circuit comprising:

a signal conversion module, which is configured for converting parallel signals input from an external circuit into a serial signal and outputting it to a signal configuration module;

the signal configuration module, which is configured for receiving the serial signal output by the signal conversion module and a second clock frequency signal input from the external circuit, shifting the phase of the serial signal output by the signal conversion module by 0 degree or 360 degrees, and outputting the phase-shifted serial signal to a first enable signal generation module;

the first enable signal generation module, which is configured for receiving the phase-shifted serial signal, generating a first enable signal, and outputting it to a DDR configuration module and a phase monitoring module;

the DDR configuration module, which is configured for receiving the DQS signal input from the external circuit and the first enable signal, generating a second enable signal; and setting DDR mode of the programmable circuit based on a first gate control signal input from the external circuit and a second gate control signal input from the external circuit, as well as a ddr_mode signal input to the phase monitoring module from the external circuit;

the phase monitoring module, which is configured for monitoring the phase of the DQS signal and outputting monitoring results to the external circuit; receiving the first enable signal output from the first enable signal generation module, and monitoring the position that the phase of the DQS signal relative to a DQS_gating signal based on the DQS signal and the first enable signal generated by the first enable signal generation module; the first enable signal is processed by the DDR configuration module to generate the DQS_ena signal, the logical AND of the DQS_ena signal and the DQS signal generates the DQS_gating signal; the phase monitoring module receives the read_clk_ctrl[2:0] signal input from the external circuit; the external circuit receives the output value from the output terminal of the phase monitoring module, based on the output value from the output terminal of the phase monitoring module;

a phase adjustment module, which is configured for adjusting the phase of the first enable signal generated by the first enable signal generation module based on the monitoring results input from the external circuit.

18. The electronic device as claimed in claim 17, the programmable circuit further comprising a first AND gate, a second AND gate, an OR gate, and a frequency divider;

a first input terminal of the first AND gate receives the global reset signal from the external circuit and is connected to the reset terminals of the signal conversion module, the signal configuration module, the first enable signal generation module, the phase monitoring module, and the phase adjustment module; a second input terminal of the first AND gate receives the local reset signal from the external circuit; an output terminal of the first AND gate is connected to the reset terminals of the DDR configuration module and the frequency divider;

a first input terminal of the second AND gate receives the DQS signal from the external circuit, and the second input terminal receives the second enable signal outputted by the DDR configuration module; the output terminal of the second AND gate outputs the logical AND signal of the DQS signals and the second enable signal to the DDR configuration module, the logical AND signal is referred to as the DQS_gating signal;

a first input terminal of the OR gate receives the DQS phase direction signal from the external circuit, and a second input terminal receives the second enable signal outputted by the DDR configuration module, a second input terminal of the OR gate is triggered at a low level, an output terminal of the OR gate outputs the logical OR signal to the frequency divider;

an input terminal of the frequency divider receives the logical OR signal outputted from the OR gate, and an output terminal of the frequency divider outputs the half-frequency signal of the DQS phase direction signal to the DDR configuration module.

19. The electronic device as claimed in claim 18, wherein the programmable circuit further comprising:

a Gray-to-Thermometer Code conversion module, which is configured for converting the Gray code input from the external circuit into thermometer code and outputting it to a delay chain module;

the delay chain module comprises a first delay chain region and a second delay chain region, the first delay chain region which is configured for receiving the DQS_gating signal outputted by the second AND gate and the delay chain enable signal, the second delay chain region which is configured for receiving the logical OR signal outputted by the OR gate and the delay chain enable signal, the delay chain module which is configured for generating a 45-degree phase shift between the DQS signal and the DQ signal.

20. The electronic device as claimed in claim 18, wherein the parallel signal is a 4-bit DQS_gate_ctrl signal, the signal conversion module further comprising:

a first rate mode, where the clock frequency of the first clock (clk_slow) in the signal conversion module is equal to the clock frequency of the second clock (clk_fast), and the serial signal uses a single-bit DQS_gate_ctrl signal;

a second rate mode, where the clock frequency of the first clock (clk_slow) in the signal conversion module is half of the clock frequency of the second clock (clk_fast), with a ratio of 1:2, and the serial signal uses a two-bit DQS_gate_ctrl signal;

a third rate mode, where the clock frequency of the first clock (clk_slow) in the signal conversion module is one-fourth of the clock frequency of the second clock (clk_fast), with a ratio of 1:4, and the serial signal uses a four-bit DQS_gate_ctrl signal;

the clock frequency of the first clock and the clock frequency of the second clock are provided by the external circuit.

\* \* \* \* \*